(12) United States Patent
Grisenthwaite

(10) Patent No.: US 6,708,317 B2
(45) Date of Patent: Mar. 16, 2004

(54) VALIDATING INTEGRATED CIRCUITS

(75) Inventor: Richard Roy Grisenthwaite, Royston (GB)

(73) Assignee: ARM Limited, Cambridge (GB)

( * ) Notice: Subject to any disclaimer, the term of this patent is extended or adjusted under 35 U.S.C. 154(b) by 87 days.

(21) Appl. No.: 10/023,835

(22) Filed: Dec. 21, 2001

(65) Prior Publication Data

US 2002/0104062 A1 Aug. 1, 2002

(30) Foreign Application Priority Data

Jan. 26, 2001 (GB) ............................................... 0102120

(51) Int. Cl.⁷ ........................... G06F 17/50; G06F 11/26
(52) U.S. Cl. ................................. 716/4; 716/5; 716/18; 703/14; 714/733
(58) Field of Search ............................ 716/4, 5, 18, 14; 703/14; 714/733, 726

(56) References Cited

U.S. PATENT DOCUMENTS

| | | | | |
|---|---|---|---|---|
| 5,715,171 A | * | 2/1998 | Mori et al. | 716/18 |
| 5,889,788 A | * | 3/1999 | Pressly et al. | 714/726 |
| 5,949,692 A | * | 9/1999 | Beausang et al. | 716/18 |
| 6,240,543 B1 | * | 5/2001 | Bhandari | 716/18 |
| 6,249,893 B1 | * | 6/2001 | Rajsuman et al. | 714/741 |
| 6,427,224 B1 | * | 7/2002 | Devins et al. | 716/4 |
| 6,456,961 B1 | * | 9/2002 | Patil et al. | 703/14 |
| 6,487,699 B1 | * | 11/2002 | Devins et al. | 716/4 |
| 6,553,524 B1 | * | 4/2003 | Das | 714/726 |
| 6,571,373 B1 | * | 5/2003 | Devins et al. | 716/5 |
| 2001/0004123 A1 | * | 6/2001 | Nishikawa | 257/368 |
| 2002/0091979 A1 | * | 7/2002 | Cooke et al. | 714/733 |

FOREIGN PATENT DOCUMENTS

| | | |
|---|---|---|
| GB | 2 245 728 | 1/1992 |
| GB | 2 311 397 | 9/1997 |
| GB | 2 321 118 | 7/1998 |
| GB | 2 325 325 | 11/1998 |
| GB | 2 337 346 | 11/1999 |
| GB | 2 338 573 | 12/1999 |
| GB | 2 350 917 | 12/2000 |

OTHER PUBLICATIONS

Y. Zorian et al, "Testing Embedded–Core Based System Chips" ITC 1998.

* cited by examiner

*Primary Examiner*—Vuthe Siek
*Assistant Examiner*—Magid Y Dimyan
(74) *Attorney, Agent, or Firm*—Nixon & Vanderhye P.C.

(57) ABSTRACT

A microprocessor core 4 is modeled using an obscured model 22 of the core functionality and a non-obscured model 24 of the scan chains that in that particular instance are associated with the microprocessor core 4. Validation of the design of a scan chain controller 12 can be achieved using the non-obscured scan chain model 24. Different scan chain models 24 can be relatively easily provided to model different scan chain physical configurations whilst leaving the more difficult to produce obscured core model 22 unaltered.

25 Claims, 4 Drawing Sheets

VALIDATING INTEGRATED CIRCUITS

BACKGROUND OF THE INVENTION

1. Field of the Invention

This invention relates to the validation of integrated circuit designs. More particularly, this invention relates to the validation of integrated circuit designs in which part of the design is obscured to maintain its confidentiality.

2. Description of the Prior Art

An important part of the development of a new integrated circuit is the validation of the design for that circuit. This typically takes place before any physical examples of the integrated circuit are produced in an effort to remove errors from the design. Sophisticated computer program tools exist to assist in this validation process.

A typical design validation process will use models of different portions of an integrated circuit design and with these models test that signals are correctly exchanged and processed by the different elements within the integrated circuit as a whole. It will be appreciated that with the increase in system-on-a-chip designs, an integrated circuit may contain different portions provided by different suppliers. As an example, a single integrated circuit may include a microprocessor core provided by a first supplier, a random access memory provided by a second supplier and a number of peripheral devices provided by a third supplier. The designs of many of these portions represent confidential and valuable property. In order to protect this property, it is known to provide obscured models of portions of integrated circuits that can be used in design validation and yet do not reveal valuable information regarding the internal design of that portion.

A problem with obscured models is that it is difficult for someone other than the originator of that model to make any changes to it. This can cause problems as it is desirable that at least some trusted parties other than the originator of the obscured model should be able to slightly alter that model for their own purposes. An example of this is that different users of a microprocessor core represented by an obscure model may wish to provide different sets of scan chains for use in testing that microprocessor core. Whilst one of these scan chains may be a wrapper scan chain provided outside of the microprocessor core, it is likely that further scan chains will be within the interior of the microprocessor core and accordingly will require modification of the obscured model of that microprocessor core if they are to be properly modeled by that obscured model during the validation process.

SUMMARY OF THE INVENTION

Viewed from one aspect the present invention provides a method of validating an integrated circuit design having a plurality of circuit portions including:

(i) a prevalidated circuit portion having an obscured prevalidated circuit portion represented by an obscured prevalidated circuit portion model and a non-obscured prevalidated circuit portion represented by a non-obscured prevalidated circuit portion model, and (ii) an unvalidated circuit portion represented by an unvalidated circuit portion model, said method comprising the steps of:

(iii) simulating interaction between said unvalidated circuit portion and said non-obscured prevalidated circuit portion using said unvalidated circuit portion model and said non-obscured prevalidated circuit portion model; and (iv) verifying correct interaction of said unvalidated circuit portion model and said non-obscured prevalidated circuit portion model during said step of simulating interaction between said unvalidated circuit portion and said non-obscured prevalidated circuit portion to validate design of said unvalidated circuit portion in interaction with said non-obscured circuit portion, wherein (v) said unvalidated circuit portion model does not interact with said obscured prevalidated circuit portion model during said step of simulating interaction between said unvalidated circuit portion and said non-obscured prevalidated circuit portion, and said prevalidated circuit portion includes one or more scan chains, said one or more scan chains being part of said non-obscured circuit portion and modeled by said non-obscured prevalidated circuit portion model.

The invention recognizes that whilst a prevalidated circuit portion, such as a microprocessor core and its associated scan chains, that is provided on a general basis should preserve the confidentiality of the important information, it is possible to segment the model provided into an obscured part and a non-obscured part. The obscured part can be provided by the originator of the valuable design and the non-obscured part, for example, provided by the originator or by trusted parties to model those portions of the prevalidated circuit portion over which it is desired to give those trusted parties some control. This prevalidated model having obscured and non-obscured portions that is then released to, for example, a system-on-a-chip provider enables validation of the circuits produced by that system-on-a-chip provider to be carried out using a prevalidated model for a portion of that design and maintains the confidentiality of the crucial design information whilst allowing a degree of flexibility in the design of the prevalidated portion without requiring a completely new obscured model to be generated.

As a specific example, a microprocessor core design may be represented by an obscured model. This design may be released to trusted parties who customize the design to a form in which it can be manufactured by their particular manufacturing processes and which will have its own set of most appropriate scan chains. When this microprocessor core and associated scan chains are included within a larger system-on-a-chip design, it is important that the complete design including interaction with both the microprocessor core represented by the obscured model and the scan chains associated with the non-obscured model are properly validated. A mistake in the way the system-on-a-chip integrated circuit is produced associated with the operation of the scan chains may be just as difficult and expensive to rectify as one associated with the operation of a microprocessor core. However, providing a non-obscured model of the scan chains allows these to be validated as part of the design without revealing valuable confidential information regarding the interior of the microprocessor core that is represented by the difficult to produce and tightly controlled obscured model.

It will be appreciated that whilst the above specific example refers to microprocessor cores and scan chains (both wrapper scan chains and internal scan chains), the invention may also be used for different circuit portions within an integrated circuit design. For example, the logic for a custom functional block (such as a coprocessor) that is added by a trusted party to an existing processor.

Viewed from another aspect the present invention also provides a model for a prevalidated portion of an integrated circuit having an obscured prevalidated circuit portion and a non-obscured prevalidated circuit portion, said model comprising:

(i) an obscured prevalidated circuit portion model representing said obscured prevalidated circuit portion; and (ii) a non-obscured prevalidated circuit portion model representing said non-obscured prevalidated circuit portion, wherein (iii) said prevalidated circuit portion includes one or more scan chains, said one or more scan chains being part of said non-obscured circuit portion and modeled by said non-obscured prevalidated circuit portion model.

Viewed from a further aspect the invention also provides a method of producing a model of a prevalidated portion of an integrated circuit having an obscured prevalidated circuit portion and a non-obscured prevalidated circuit portion, said method comprising the steps of:

(i) providing an obscured prevalidated circuit portion model representing said obscured prevalidated circuit portion;

(ii) generating a representation of said prevalidated circuit portion including both said obscured prevalidated circuit portion and said non-obscured prevalidated circuit portion; and (iii) using data derived from said step of generating said representation of said prevalidated circuit portion to generate a non-obscured prevalidated circuit portion model representing said non-obscured prevalidated circuit portion; whereby (iv) said obscured prevalidated circuit portion model and said non-obscured prevalidated circuit portion model together represent said prevalidated circuit portion, wherein (v) said representation of said prevalidated circuit portion is a representation of component placement and signal routing for said prevalidated circuit portion, and said non-obscured prevalidated circuit portion comprises one or more scan chains.

Further aspects of the invention, including aspects of the invention represented by a computer program product, such as a computer program recorded on a recording medium or transmitted via a network, are also set out in the appended claims.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
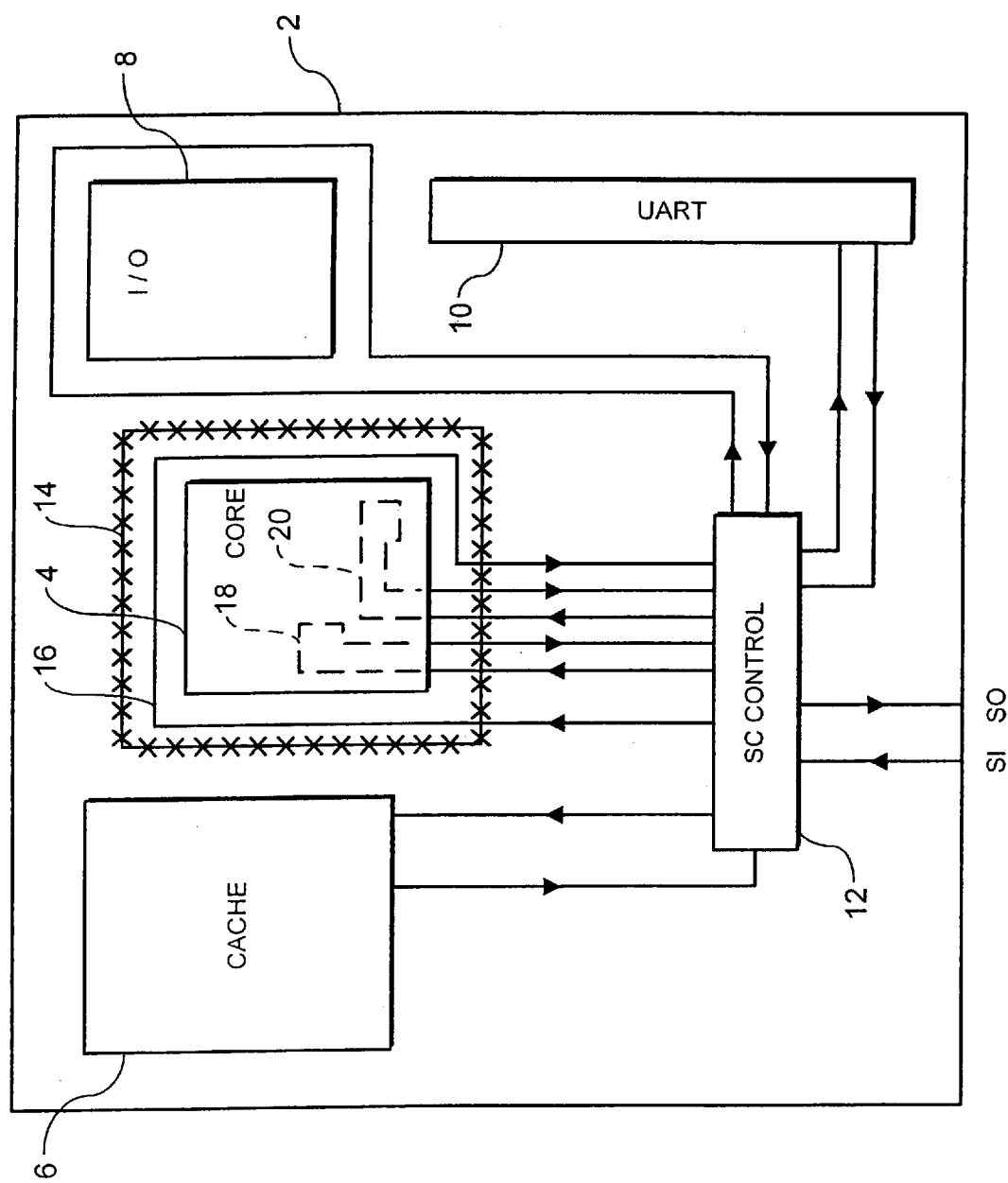
FIG. 1 schematically illustrates a system-on-a-chip integrated circuit.

FIG. 1 schematically illustrates an integrated circuit 2 composed of a microprocessor core 4, a cache memory 6, an input/output circuit 8 and a UART circuit 10. Each of these different components of the integrated circuit 2 has one or more serial scan chains associated with it. These serial scan chains are all controlled by a scan chain controller 12.

The producer of the integrated circuit 2 may acquire the design of the microprocessor core 4 from another party. Accordingly, in the illustrated example, the portion within the box 14 has been provided to the integrated circuit producer who does not know the details of its design. This portion includes both a wrapper scan chain 16 and a plurality of internal scan chains 18, 20. The contents of the box 14 have been prevalidated by their supplier. However, it is important that the interaction between the contents of the box 14 and the scan chain controller 12 should be validated as correct. As an example, a single inappropriate inverter within the scan chain path that is part of the scan chain controller could cause incorrect test results to be produced when those scan chains were used to test the proper manufacture of the integrated circuit 2. The scan chain controller 12 also controls scan chains associated with the cache memory 6, the input/output circuit 8 and the UART circuit 10.

Figure 2:
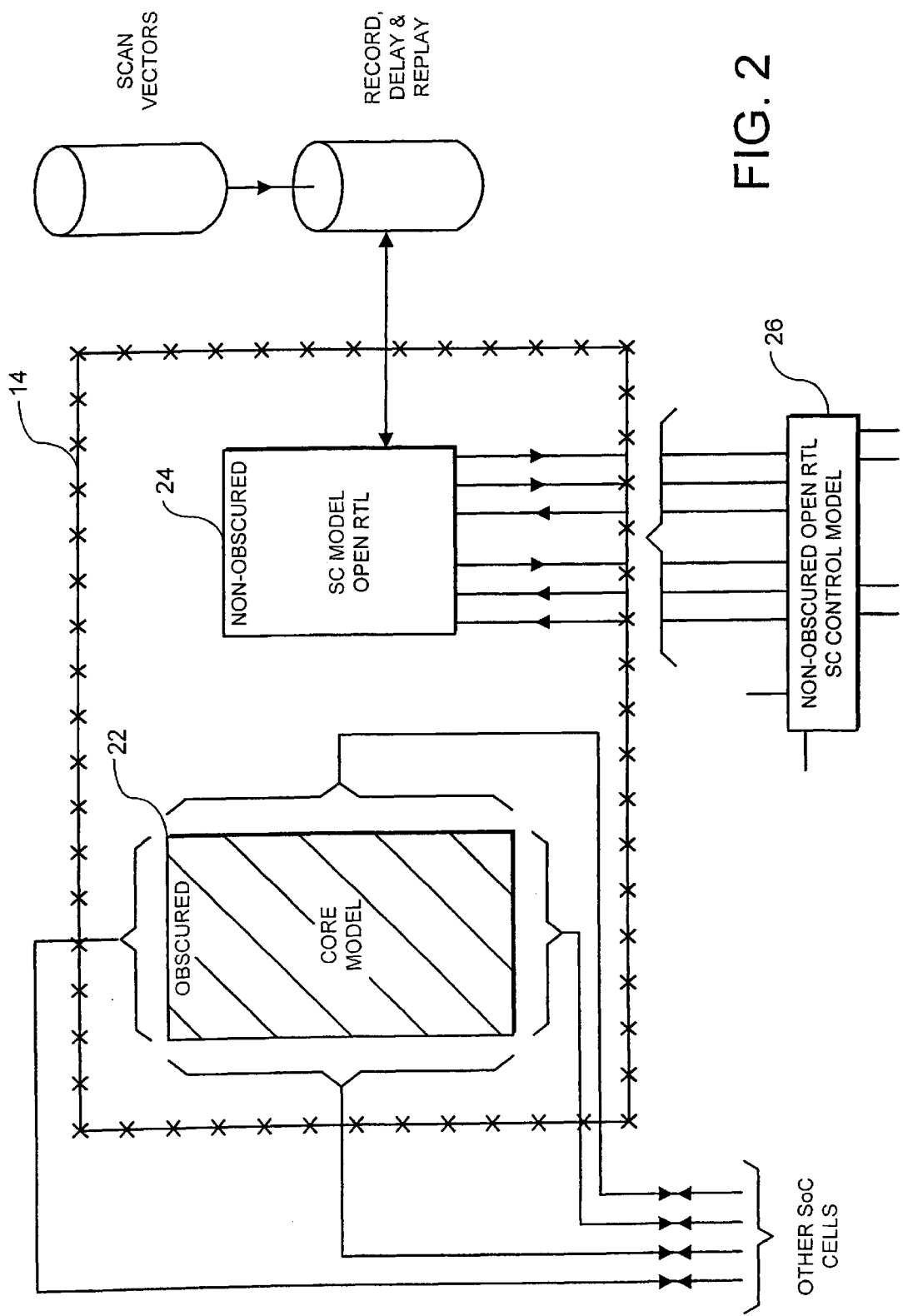
FIG. 2 schematically illustrates a model of a microprocessor core including an obscured portion and a non-obscured portion.

FIG. 2 schematically illustrates the model of the prevalidated portion 14 that is provided to the producer of the integrated circuit 2 to validate the integrated circuit 2 as a whole. This model includes an obscured portion 22 and a non-obscured portion 24. The obscured portion 22 models the microprocessor core with its many complex input and output signals and behavior. The non-obscured model 24 models the scan chains 16, 18 and 20 that are added to the microprocessor core 4 to suit the particular circumstances. The obscured model 22 has a defined signal interface via which it communicates with other elements (cells) within the system-on-a-chip integrated circuit 2 to enable validation of that interaction to take place. The non-obscured scan chain model 22 is provided in open RTL (register transfer language) that may be readily produced to suit the particular requirements in an individual case with much less difficulty than would be associated with producing a new obscured model 22 that also modeled the particular scan chains used in that instance. In practice, the verification of the interaction between the scan chain controller 12 and the core 4 can be achieved by testing the interaction between the non-obscured scan chain model 24 and a scan chain controller model 26 that is produced by the integrated circuit producer without needing any interaction with the obscured core model 22. The interaction between the obscured core model 22 and the non-obscured scan chain model 24 has already been validated by the provider of these elements and accordingly need not be examined when validating the design of the scan chain controller 12 using the scan chain controller model 26. On a practical level, the interaction between the scan chain controller model 26 and the non-obscured scan chain model 24 can be examined by modeling the scanning in and scanning out of the test vectors for the microprocessor core 4 to check this is correctly performed. In practice the non-obscured scan chain model 24 can be very simple with the function of a scan chain being one that records serially input data, delays it for a predetermined period and then replays that or other data. The correct scanning out of known correct responses to input test vectors can also be verified.

Figure 3:
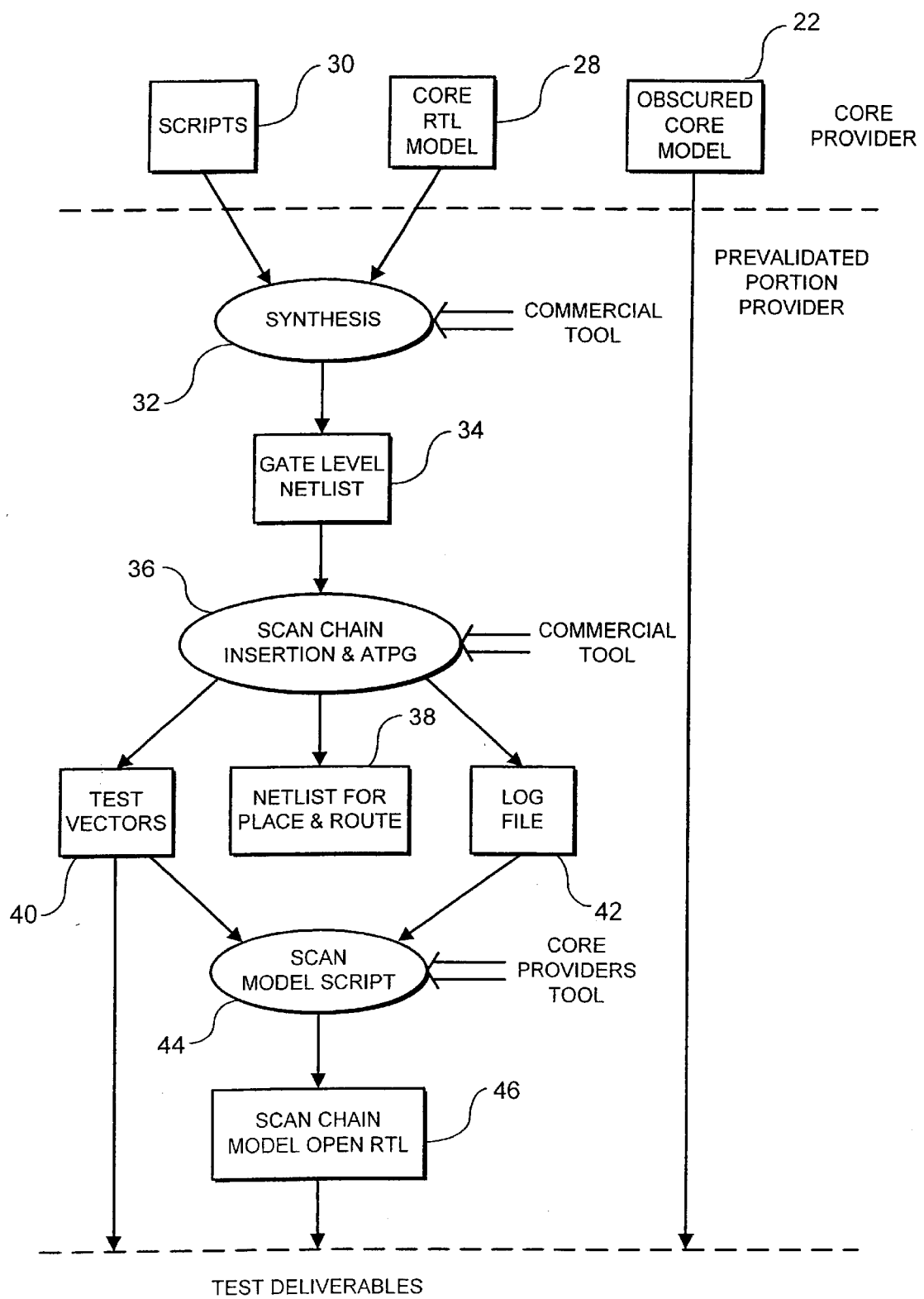
FIG. 3 schematically illustrates the generation of the test deliverables in the production of a integrated circuit.

FIG. 3 schematically illustrates the process of producing test deliverables for a microprocessor core. The core provider generates an obscured core model 22 as well as a non-obscured core model 28 and scripts 30 for synthesizing a core design using that non-obscured core model 28. These three items 22, 28 and 30 are provided by the core provider to a trusted party who generates a prevalidated microprocessor design and its associated test deliverables. Different such trusted providers may use different manufacturing processes that require different scan chains and test patterns to be used to test for correct manufacture of their design. The process of synthesis 32 using the scripts 30 and the non-obscured core model 28 generates a gate level net list 34 for the microprocessor core. The appropriate scan chains and test patterns for that microprocessor core represented by the net list 34 are then generated by the scan chain insertion and automatic test pattern generation process 36. The output of this process 36 is a final net list 38 for the microprocessor core that includes both component placement and signal routing information at a level in which it can be used to fabricate the microprocessor core 4. The process 36 also produces the test vectors 40 for use with the scan chains that have been inserted and a log file 42 giving details of the scan chains that have been inserted. The process 44 then uses a scripting program to read the log file 42 and the test vectors 40 to produce a non-obscured scan chain model 46 of the inserted scan chains, such as in open RTL.

The test deliverables representing the prevalidated microprocessor core that are released are the obscured core model 22, the non-obscured scan chain model 46 and the test vectors 40. Using these three elements, the producer of the integrated circuit 2 can model the microprocessor core 4 in a manner that allows the design of the integrated circuit 2 as a whole to be validated whilst maintaining the confidentiality of the design of the microprocessor core 4. It will be appreciated that the obscured core model 22 and the non-obscured core model 46 may be combined into a single model of the core, the top level of which is unobscured and holds together the obscured core model 22 and the non-obscured core model 46.

Figure 4:
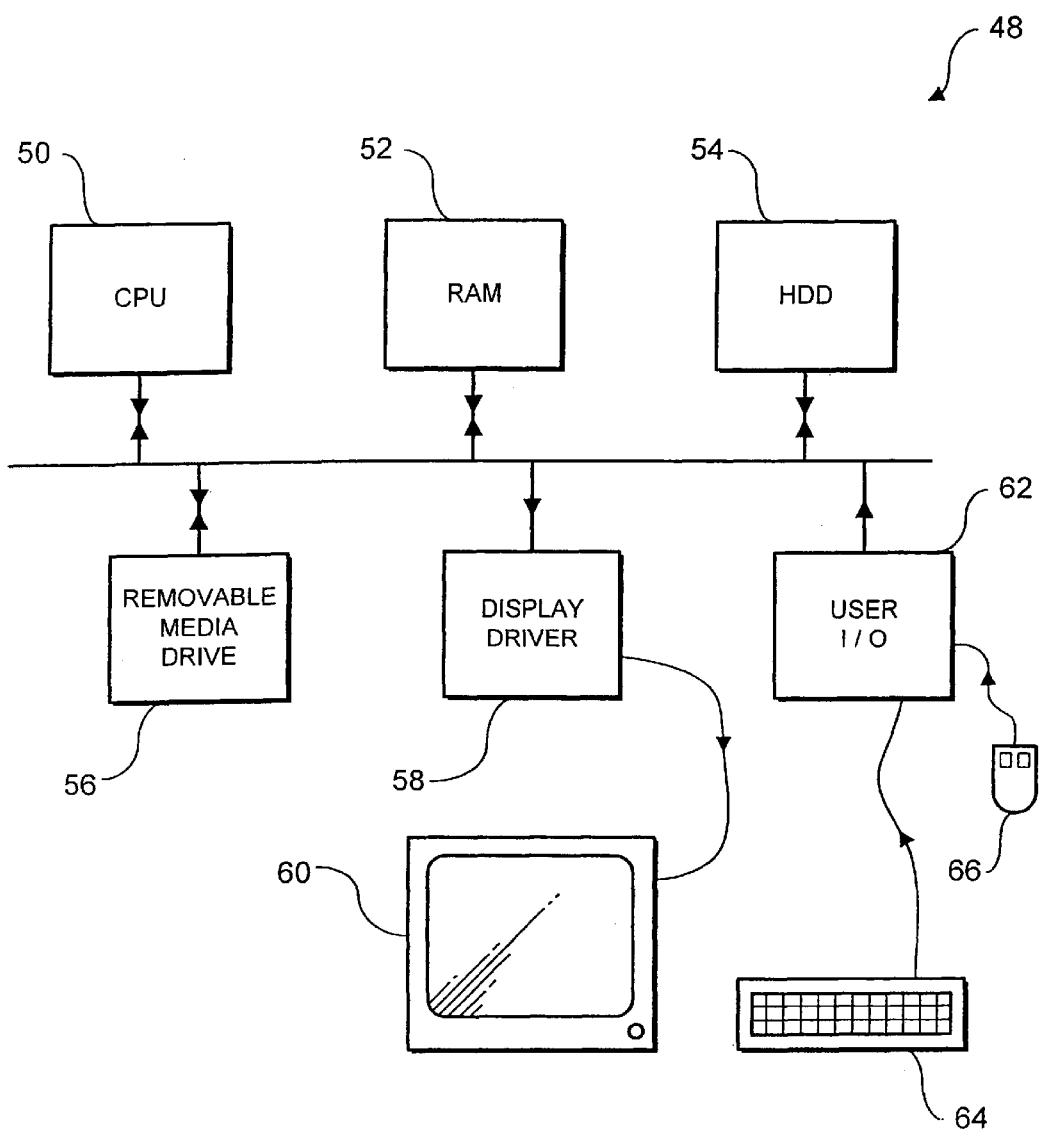
FIG. 4 schematically illustrates a general purpose computer of the type which can be used to implement the modeling techniques discussed in relation to FIGS. 1 to 3.

FIG. 4 schematically illustrates a general purpose computer 48 of the type which can be used to perform the modeling and verification/validation of designs as discussed above. This general purpose computer 48 includes a central processing unit 50, a random access memory 52, a hard disk drive 54, a removable media drive (such as a CD or floppy disk drive) 56, a display driver 58 and display 60 and a user input/output circuit 62 with an associated keyboard 64 and mouse 66.

The general purpose computer 48 executes computer programs that may be loaded via the removable media drive 56 and stored on the hard disk drive 54. During execution of these computer programs by the central processing unit 50, the working memory is provided by the random access memory 52. User displays indicating the results of the execution of the program are provided by the display driver 58 and the display 60 whilst user inputs to control the operation of the computer program are provided by the user input/output circuit 62 and the keyboard 64 and mouse 66. The circuit models may also be loaded via the removable media drive 56 and stored upon the hard disk drive 54.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A method of validating an integrated circuit design having a plurality of circuit portions including:
   (i) a prevalidated circuit portion having an obscured prevalidated circuit portion represented by an obscured prevalidated circuit portion model and a non-obscured prevalidated circuit portion represented by a non-obscured prevalidated circuit portion model, and
   (ii) an unvalidated circuit portion represented by an unvalidated circuit portion model, said method comprising the steps of:
   (iii) simulating interaction between said unvalidated circuit portion and said non-obscured prevalidated circuit portion using said unvalidated circuit portion model and said non-obscured prevalidated circuit portion model; and
   (iv) verifying correct interaction of said unvalidated circuit portion model and said non-obscured prevalidated circuit portion model during said step of simulating interaction between said unvalidated circuit portion and said non-obscured prevalidated circuit portion to validate design of said unvalidated circuit portion in interaction with said non-obscured circuit portion, wherein
   (v) said unvalidated circuit portion model does not interact with said obscured prevalidated circuit portion model during said step of simulating interaction between said unvalidated circuit portion and said non-obscured prevalidated circuit portion, and said prevalidated circuit portion includes one or more scan chains, said one or more scan chains being part of said non-obscured circuit portion and modeled by said non-obscured prevalidated circuit portion model.

2. A method as claimed in claim 1, wherein said one or more scan chains are coupled to said obscured prevalidated circuit portion in a manner to enable test input signals to be applied to said prevalidated circuit portion and test output signals to be captured from said prevalidated circuit portion.

3. A method as claimed in claim 1, wherein said one or more scan chains include one or more of:
   (i) a wrapper scan chain surrounding said obscured circuit portion; and
   (ii) an internal scan chain coupled to nodes within said obscured circuit portion.

4. A method as claimed in claim 3, wherein said scan chains include a wrapper scan chain and one or more internal scan chains that together allow all signal nodes within said obscured circuit portion to be toggled between signal states in response to test vector signals applied via said wrapper scan chains and said one or more internal scan chains.

5. A method as claimed in claim 1, wherein said prevalidated circuit portion includes a microprocessor core, said microprocessor core being part of said obscured prevalidated circuit portion and being modeled by said obscured prevalidated circuit portion model.

6. A method as claimed in claim 1, wherein obscured prevalidated circuit portion has a non-obscured signal interface and further comprising the step of:
   (i) simulating interaction of said unvalidated circuit portion and said obscured prevalidated circuit portion by said unvalidated circuit portion model and said obscured prevalidated circuit portion model exchanging signals in accordance with said non-obscured signal interface; and
   (ii) verifying correct interaction of said unvalidated circuit portion model and said obscured prevalidated circuit portion model during said step of simulating interaction of said unvalidated circuit portion and said obscured prevalidated circuit portion to validate design of said unvalidated circuit portion in interaction with said obscured circuit portion.

7. A computer program product comprising a computer program for controlling a computer to perform a method as claimed in claim 1.

8. Apparatus for validating an integrated circuit design having a plurality of circuit portions including:

(i) a prevalidated circuit portion having an obscured prevalidated circuit portion represented by an obscured prevalidated circuit portion model and a non-obscured prevalidated circuit portion represented by a non-obscured prevalidated circuit portion model, and (ii) an unvalidated circuit portion represented by an unvalidated circuit portion model, said apparatus comprising:

(iii) simulation logic operable to simulate interaction between said unvalidated circuit portion and said non-obscured prevalidated circuit portion using said unvalidated circuit portion model and said non-obscured prevalidated circuit portion model; and (iv) verification logic operable to verify correct interaction of said unvalidated circuit portion model and said non-obscured prevalidated circuit portion model during said step of simulating interaction between said unvalidated circuit portion and said non-obscured prevalidated circuit portion to validate design of said unvalidated circuit portion in interaction with said non-obscured circuit portion, wherein (v) said unvalidated circuit portion model does not interact with said obscured prevalidated circuit portion model during said step of simulating interaction between said unvalidated circuit portion and said non-obscured prevalidated circuit portion, and said prevalidated circuit portion includes one or more scan chains, said one or more scan chains being part of said non-obscured circuit portion and modeled by said non-obscured prevalidated circuit portion model.

9. A model for a prevalidated portion of an integrated circuit having an obscured prevalidated circuit portion and a non-obscured prevalidated circuit portion, said model comprising:

(i) an obscured prevalidated circuit portion model representing said obscured prevalidated circuit portion; and (ii) a non-obscured prevalidated circuit portion model representing said non-obscured prevalidated circuit portion, wherein (iii) said prevalidated circuit portion includes one or more scan chains, said one or more scan chains being part of said non-obscured circuit portion and modeled by non-obscured prevalidated circuit portion model.

10. A model as claimed in claim 9, wherein said one or more scan chains are coupled to said obscured prevalidated circuit portion in a manner to enable test input signals to be applied to said prevalidated circuit portion and test output signals to be captured from said prevalidated circuit portion.

11. A model as claimed in claim 9, wherein said one or more scan chains include one or more of:

(i) a wrapper scan chain surrounding said obscured circuit portion; and (ii) an internal scan chain coupled to nodes within said obscured circuit portion.

12. A model as claimed in claim 11, wherein said scan chains include a wrapper scan chains and one or more internal scan chains that together allow all signal nodes within said obscured circuit portion to be toggled between signal states in response to test vector signals applied via said wrapper scan chains and said one or more internal scan chains.

13. A model as claimed in claim 9, wherein said prevalidated circuit portion includes a microprocessor core, said microprocessor core being part of said obscured prevalidated circuit portion and being modeled by said obscured prevalidated circuit portion model.

14. A computer program product comprising a computer program for controlling a computer to provide a model as claimed in claim 9.

15. Apparatus for modeling a prevalidated portion of an integrated circuit having an obscured prevalidated circuit portion and a non-obscured prevalidated circuit portion, said apparatus comprising:

(i) obscured prevalidated circuit portion modeling logic representing said obscured prevalidated circuit portion; and (ii) non-obscured prevalidated circuit portion modeling logic representing said non-obscured prevalidated circuit portion, wherein (iii) said prevalidated circuit portion includes one or more scan chains, said one or more scan chains being part of said non-obscured circuit portion and modeled by said non-obscured prevalidated circuit portion model.

16. A method of producing a model of a prevalidated portion of an integrated circuit having an obscured prevalidated circuit portion and a non-obscured prevalidated circuit portion, said method comprising the steps of:

(i) providing an obscured prevalidated circuit portion model representing said obscured prevalidated circuit portion;

(ii) generating a representation of said prevalidated circuit portion including both said obscured prevalidated circuit portion and said non-obscured prevalidated circuit portion; and (iii) using data derived from said step of generating said representation of said prevalidated circuit portion to generate a non-obscured prevalidated circuit portion model representing said non-obscured prevalidated circuit portion; whereby (iv) said obscured prevalidated circuit portion model and said non-obscured prevalidated circuit portion model together represent said prevalidated circuit portion, wherein (v) said representation of said prevalidated circuit portion is a representation of component placement and signal routing for said prevalidated circuit portion, and said non-obscured prevalidated circuit portion comprises one or more scan chains.

17. A method as claimed in claim 16, further comprising the step of adding said one or more scan chains to said obscured prevalidated circuit portion.

18. A method as claimed in claim 17, further comprising the step of generating test pattern vectors to be applied via said one or more scan chains.

19. A method as claimed in claim 16, wherein said one or more scan chains are coupled to said obscured prevalidated circuit portion in a manner to enable test input signals to be applied to said prevalidated circuit portion and test output signals to be captured from said prevalidated circuit portion.

20. A method as claimed in claim 16, wherein said one or more scan chains include one or more of:

(i) a wrapper scan chain surrounding said obscured circuit portion; and (ii) an internal scan chain coupled to nodes within said obscured circuit portion.

21. A method as claimed in claim 20, wherein said scan chains include a wrapper scan chain and one or more internal scan chains that together allow all signal nodes within said obscured circuit portion to be toggled between signal states in response to test vector signals applied via said wrapper scan chains and said one or more internal scan chains.

22. A method as claimed in claim 16, wherein said prevalidated circuit portion includes a microprocessor core, said microprocessor core being part of said obscured prevalidated circuit portion and being modeled by said obscured prevalidated circuit portion model.

23. A method as claimed in claim 22, wherein said step of using data derived from said step of generating said representation of said prevalidated circuit portion to generate a non-obscured prevalidated circuit portion model applies a predetermined script program to a log file to generate said non-obscured prevalidated circuit portion model.

24. A computer program product comprising a computer program for controlling a computer to perform method as claimed in claim 16.

25. Apparatus for producing a model of a prevalidated portion of an integrated circuit having an obscured prevalidated circuit portion and a non-obscured prevalidated circuit portion, said apparatus comprising:

(i) obscured prevalidated circuit portion model logic representing said obscured prevalidated circuit portion;

(ii) first generation logic operable to generate a representation of said prevalidated circuit portion including both said obscured prevalidated circuit portion and said non-obscured prevalidated circuit portion; and (iii) second generation logic operable to use data derived from said step of generating said representation of said prevalidated circuit portion to generate a non-obscured prevalidated circuit portion model representing said non-obscured prevalidated circuit portion; whereby (iv) said obscured prevalidated circuit portion model and said non-obscured prevalidated circuit portion model together represent said prevalidated circuit portion, wherein (v) said representation of said prevalidated circuit portion is a representation of component placement and signal routing for said prevalidated circuit portion, and said non-obscured prevalidated circuit portion comprises one or more scan chains.

\* \* \* \* \*